United States Patent [19]

Vijan

[11] Patent Number: 4,696,885
[45] Date of Patent: Sep. 29, 1987

[54] METHOD OF FORMING A LARGE SURFACE AREA INTEGRATED CIRCUIT

[75] Inventor: Meera Vijan, Troy, Mich.

[73] Assignee: Energy Conversion Devices, Inc., Troy, Mich.

[21] Appl. No.: 861,756

[22] Filed: May 9, 1986

Related U.S. Application Data

[63] Continuation of Ser. No. 735,268, Apr. 26, 1985, abandoned, which is a continuation of Ser. No. 529,436, Sep. 6, 1983, abandoned.

[51] Int. Cl.[4] ............................................ H01L 21/312
[52] U.S. Cl. ................................. 430/311; 156/244.11; 427/96; 427/358; 427/420; 430/272; 430/313; 430/317; 430/935
[58] Field of Search ....................... 156/244.11; 427/82, 427/96, 358, 420; 430/272, 311, 313, 317, 935; 118/DIG. 4

[56] References Cited

U.S. PATENT DOCUMENTS

| | | |
|---|---|---|
| 4,180,604 | 12/1979 | Feng et al. |
| 4,230,793 | 10/1980 | Losert et al. ........................ 430/315 |
| 4,246,335 | 1/1981 | Keogh et al. |
| 4,260,675 | 4/1981 | Sullivan |
| 4,320,191 | 3/1982 | Yoshikawa et al. ................. 430/296 |
| 4,410,558 | 10/1983 | Izu et al. ............................... 427/39 |
| 4,431,723 | 2/1984 | Poskow |

OTHER PUBLICATIONS

Gerald B. Fefferman & Thomas V. Lake, Sealed Extrusion—A Coating Method for Photoprinting UV Curable Liquid Resin Films, 1978, AFP/SME Technical Paper.

W. S. DeForest, *Photoresist Materials and Processes*, McGraw-Hill, pp. 35-59.

*Primary Examiner*—John D. Smith

[57] ABSTRACT

A method of forming a large area electronic element, e.g., a large area integrated microelectronic circuit which has at least one dimension in excess of three inches, by forming a film of photoresist separate from a surface to be etched, and thereafter depositing the film of photoresist on the surface to be etched. The deposited photoresist film is then exposed to actinic radiation and developed, and the exposed, underlying surface may thereafter be etched.

The method for depositing the photoresist involves passing a viscous liquid composed of photoresist and solvent under positive pressure through a very thin elongated orifice that extends across and in close proximity to (e.g., 0.01 inch or less), but spaced apart from the surface to be processed to form a very thin flexible continuous film of liquid photoresist composition issuing from the orifice. The surface to be processed is linearly moved past the orifice so as to deposit the issued film of photoresist on the surface, in a thickness no greater than 100 microns, and preferably much less. The wet deposited film is then heated to drive off the solvent thereby reducing the thickness of the photoresist. The method disclosed herein is particularly suitable for processing large area rectangular substrates and continuous flexible substrates used in roll-to-roll processing equipment.

41 Claims, 3 Drawing Figures

METHOD OF FORMING A LARGE SURFACE AREA INTEGRATED CIRCUIT

This application is a continuation of U.S. application Ser. No. 735,268 filed Apr. 26, 1985, now abandoned, which is a continuation of U.S. application Ser. No. 529,436 filed Sept. 6, 1983, now abandoned.

BACKGROUND

Integrated electronic circuits are typically prepared by sequentially depositing patterned thin film layers, e.g., of connectors, contacts and conductors, atop a crystalline wafer or chip in well defined patterns. These patterned layers may be deposited by evaporation masking or photolithography.

In evaporation masking a physical barrier of the appropriate shape is present in close contact with the surface on which the thin film layer is to be deposited. The barrier intercepts defined portions of the evaporant beam. The portions intercepted are prevented from condensing on the surface. The evaporation beam condensate forms the thin film pattern on the surface.

In photolithography, also known as subtractive etching, the thin film is already present on the surface, and the desired pattern is formed in the thin film by selective removal of portions of the film. The removal is accomplished by the use of light sensitive organic lacquers, i.e., photoresists. The photoresist is deposited atop the thin film, and the desired pattern is formed in the photoresist layer by actinic radiation. Development of the photoresist layer causes a significant difference in the solubility of the exposed and the unexposed regions of the photoresist layer. The more soluble region of the photoresist layer is removed by a suitable solvent. In this way, a portion of the underlying thin film is uncovered for the etchant and may be etched, leaving behind the desired surface pattern.

In the photolithographic process the pattern is defined by a stencil or a mask, i.e., a photomask. The mask is a precision image of the pattern to be etched. It is prepared by the 200 fold to 1000 fold photographic reduction of the original art work. The original art work shows the pattern to be formed on the thin layer at a scale readable by the unaided human eye.

In the photolithographic process a polymeric photoresist layer is formd on the thin film to be etched. The photoresist layer is then exposed to actinic radiation through the photomask, e.g., by contact printing. Actinic radiation renders one portion of the photoresist relatively more soluble, and the other portion relatively less soluble. The more soluble portion of the photoresist is removed, e.g., by solubilization with a suitable solvent, uncovering portions of the thin film. The uncovered portions of the thin film are then removed by etching, leaving behind a facsimile or reverse facsimile of the photo mask pattern.

Prior art techniques for formation of the film of the polymeric photoresist have been developed for and are especially adapted to small, rigid elements. As described in the prior art, small, rigid elements are elements having no linear dimension greater then about 3 inches. They are formed on or encompass a rigid, non-flexible element, for example a monocrystalline element, that is substantially free from warpage or bow. The prior art photoresist application techniques include spraying, dipping, spin or whirl coating, and gravure rolling. Most commonly spin coating techniques have been used. In spin coating, also known as whirl coating, a pool of photoresist composition, i.e., a pool of photoresist polymer is solvent, is formed on a surface of the element to be coated. Thereafter the element is rotated at a speed of about 2000 to about 6000 revolutions per minute, whereby to deposit the photoresist composition substantially uniformly across the surface of the small, rigid element. The thickness of the photoresist deposit is a function of the viscosity and density of the photoresist composition, and the angular velocity of the element to be coated.

Spin coating has been found to be unsuitable for both large, non-rigid, flexible elements, and for continuous processes. More particularly, spin coating has been found to be unsuitable for roll to roll processes for the formation of micro circuits on flexible substrates, which substrates are of width greater than about 3 inches, which substrates are drawn from one roll through various deposition processes to a subsequent roll.

Similarly roller coating, also known as gravure coating, has been found to be non optimum for large, flexible, non rigid elements.

SUMMARY OF THE INVENTION

It has now been found that a film of photoresist polymer in solvent may be formed, for example, by extrusion, and thereafter deposited on the surface to be coated. According to the method of this invention a patterned, thin film layer of an electronic circuit is formed by the method comprising depositing photoresist material atop an etchable surface of an element of the circuit and exposing a portion of the photoresist material to actinic energy with formation of soluble and insoluble portions thereof. The soluble portions of the photoresist are then removed, uncovering a portion of the etchable surface of the element, and the uncovered portion of the etchable surface of the element is then etched to form the patterned, thin film layer. As herein contemplated the photoresist is deposited by the method of forming a film of photoresist composition comprising photoresist polymer and solvent, where the film of photoresist polymer is formed separate from the etchable thin film surface of the circuit element, and thereafter depositing the film of photoresist composition on the etchable thin film surface of the circuit element.

By a film of photoresist composition is meant a substantially continuous, viscous web that is capable of maintaining its form and integrity between its discharge from the extruder and its deposition on the surface of the circuit element, as distinguished from a spray of substantially discontinuous particles.

According to a particularly preferred exemplification of the invention, there is provided a method of forming an electronic element or circuit, for example, an integrated circuit, having a continuous, flexible, mechanical, structural substrate supporting the circuit elements, the substrate having at least one surface dimension in excess of 3 inches. According to this exemplification, the flexible, mechanical, structural substrate is withdrawn from a roll of substrate material and passed through at least one stage of amorphous semiconductor material deposition means. This deposits at least one layer of amorphous semiconductor material on the flexible, structural, mechanical substrate. The deposit of amorphous semiconductor material has an etchable external surface. Subsequently, a film of photoresist composition is formed and deposited atop the etchable external surface. The film of photoresist composition is exposed to actinic radiation through a photo mask, forming soluble and insoluble portions. The soluble portions of the photoresist film are removed, recovering a patterned portion of the etchable surface. The recovered portions of etchable surface are then removed whereby to define a circuit element that is a facsimile or reverse facsimile of the photo mask pattern.

THE FIGURES

The method of this invention may be understood with reference to the figures attached hereto.

DETAILED DESCRIPTION OF THE INVENTION

Figure 1:
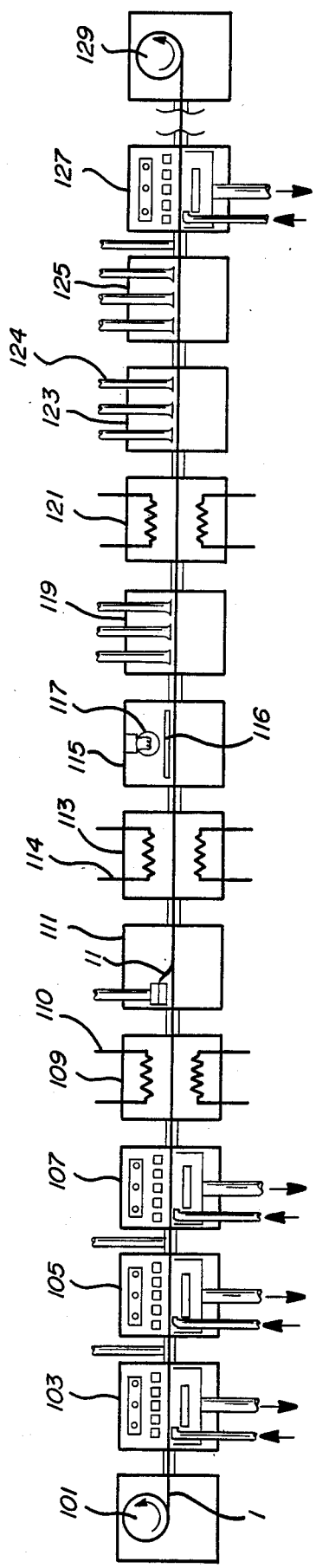
FIG. 1 shows a schematic view of the method of this invention where the flexible, mechanical substrate is withdrawn from a roll, passed through amorphous semiconductor deposition means, and thereafter passed through various chambers for photolithography, including extrusion formation of the photoresist, followed by deposition of a subsequent amorphous semiconductor layer atop the etched thin film.

The invention herein is a method of forming an electronic element, for example an integrated circuit, by the method of depositing a photoresist atop an etchable surface of a thin film of the circuit element, and exposing a portion of the photoresist to actinic radiation through a photomask whereby to form a facsimile or reverse facsimile of the photomask in the photoresist film. The actinic radiation forms relatively soluble and relatively insoluble portions corresponding to the photomask pattern in the photoresist film. The soluble portion of the photoresist is removed. This uncovers a portion of the etchable, thin film surface of the circuit element. The uncovered portion of the etchable thin film surface of the circuit element is then removed by etching.

The invention is characterized in that the photoresist composition is deposited by the method comprising forming a film of photoresist composition separate from the etchable thin film surface of the circuit element and thereafter depositing the film of photoresist composition on the etchable surface of the circuit element.

According to a particularly preferred exemplification of the invention, there is provided a method of forming an electronic circuit, for example an integrated circuit, on a continuous, flexible, mechanical substrate, where the mechanical substrate has at least one linear surface dimension in excess of 3 inches. According to this exemplification the continuous, flexible, mechanical substrate is substantially continuously withdrawn from a roll of substrate material and passed through at least one stage of amorphous semiconductor deposition means. Exemplary amorphous semiconductor deposition means are described in U.S. Pat. No. 4,217,374 to Stanford R. Ovshinsky et al for Amorphous Semiconductor Equivalent To Crystalline Semiconductors, and U.S. Pat. No. 4,226,898 to Stanford R. Ovshinsky et al for Amorphous Semiconductor Equivalent To Crystalline Semiconductors Produced By A Glow Discharge Process.

In this way there is deposited at least one layer of amorphous semiconductor material on the flexible, mechanical substrate. The deposit of amorphous semiconductor material has an etchable external surface, in which it is desired to etch a pattern, e.g., to define, connect, or isolate elements. A film comprising photoresist composition is formed separate from the etchable external surface of the amorphous semiconductor material and is thereafter deposited atop the etchable external surface. A photomask is placed between a source of actinic radiation and the deposited, photoresist film, and the photoresist film is exposed to actinic radiation. This causes regions of relatively high solubility and relatively low solubility to form in the photoresist film. The regions of high solubility are removed, uncovering a pattern corresponding to the photomask or the reverse thereof in the etchable surface of the amorphous semiconductor material, and overlaying the other portions of the amorphous semiconductor material. The uncovered portions of the etchable surface of the amorphous semiconductor material are removed by chemical etchants, forming a pattern corresponding to the photomask or the reverse thereof in the amorphous semiconductor material.

According to the invention herein, the photoresist composition is passed through an orifice to form a film thereof and the thusly formed film of photoresist composition is thereafter deposited on the etchable surface of the circuit element. More particularly, the orifice is an elongate horizontal orifice and the circuit element to be coated moves linearly past the orifice.

In a particularly preferred exemplification of the invention the linear velocity of the element intended to be coated is greater than the linear velocity of the photoresist composition issuing through the orifice whereby photoresist composition film is drawn down between the orifice and the etchable surface. That is, the photoresist film is forced through the orifice at a relatively large thicknesses, i.e., the thickness of the orifice, and the higher linear velocity of the element to be coated thins and stretches the film of photoresist composition to form a deposited film of lesser thickness.

The photoresist may be a negative photoresist, rendered less soluble by illumination whereby to yield a complementary or negative facsimile of the photomask. Alternatively, and more preferably, the photoresist is a positive photoresist which is rendered more soluble by illumination whereby to yield a positive facsimile of the photomask.

Negative photoresists are those in which the illuminated area is rendered insoluble relative to the unexposed or masked areas of the photoresist. Negative photoresist resins are polymers having unsaturation, and are further polymerized by actinic radiation. The resin itself need not be photosensitive, but it must be capble of being rendered insoluble through reaction with a sensitizer. The sensitizer is capable of activation by actinic radiation.

Exemplary negative photoresist resins include the photoactive cinnamates, such as polyvinyl cinnamates, polystyrene-cinnamyl ketones, and polyvinyl cinnamylidene acetates; diallyl phthalate prepolymer resins; and isoprenoid resins.

The photoresist polymers are dispersed or dissolved in a solvent with a sensitizer, i.e., an activator or initiator. Photo sensitizers for negative photoresists are activated by near ultraviolet actinic radiation having wavelengths of 200 to 400 nanometers.

Exemplary sensitizers for cinnamates and diallyl phthalates include azido compounds, e.g., 4,4'-azido dibenzal aldehyde; nitro compounds such as p-Nitrodiphenyl, and alphanitronaphthalene; nitroaniline derivatives such as 4-Nitro-2-chloroaniline, 2,4,6-Trinitroaniline, and 5-Nitro-2-amino toluene; anthrones, such as 2-Keto-3-methyl-1,3-dibenzanthrone; quinones, such as 1,2-Benzanthraquinone, Beta-Chloroanthaquinone, and 9,10-Anthraquinone; diphenyls, such as 4,4-Tetramethyldiaminodiphenyl ketone and the analogous carbinol, and 4,4i-Tetramethyldiaminohenzophenone; and the thiazolines, such as 1-Methyl-2-benzoylmethyl enenaphthothiazoline, 2-Methyl-X-nitro-Beta-naphthathiozole, and 1-Ethyl-2-aretylmethylene-Beta-naphthiazoline. Gernally, the amount of sensitizer is from about 0.5 to about 10 weight percent, basis weight of polymer, and preferably from about 1.5 to about 3.0 weight percent, basis weight of polymer.

Exemplary sensitizers for isoprenoids are azides, including 4,4'-Diazidostilbene, 4,4'-Diazidobenzophenone, 2,6-Di(4i-azidobenzal)-4-methyl cyclohexanone, and 4,4'-Diazidodibenzal acetone. Preferred are the azides with carbonyl linkages. Especially preferred is 2,6-Di-(4i-azido benzal)-4 methyl cyclohexanone, because of its stability and solubility.

Additionally, various stabilizers and additives may be present to retard scum formation and thermal polymerization.

Suitable solvents for negative photoresists include: 1,4-Dioxane; aliphtic esters, for example butylacetate, and cellosolve acetate, that is, 2-ethoxy ethyl acetate; cellosolve ethers such as ethylene glycol monoethyl ether, and ethylene glycol momomethyl ether; aromatic hydrocarbons, for example xylene, and ethyl benzene. Alternatively, chlorinated hydrocarbons, such as chlorobenzenes, and methyolyne chloride may be used; ketones, especially acetone and cyclical ketones such as cyclohexanone may be used.

Alternatively, the photoresist material may also be a positive photoresist material having a positive photoresist polymer dispersed in a suitable solvent. Positive photoresist polymers are low molecular weight polymers characterized by the substantial absence of unsaturation. A particularly preferred positive photoresist polymer is Novolak resin, a phenol terminated phenol-formaldehyde polymer. Other polymers may be present with the Novolak resin, and monomers thereof can even be polymerized with the phenol-terminated phenol-formaldehyde Novolak resin. These include styrene, methyl styrene, styrene-maleic anhydride, styrene-acrylic acid, styrene-methacrylic acid, melamine, melamine-sucrose benzoate, and the like.

Exemplary positive photoresist sensitizers include quinone diazides, such as Benzoquinone 1,2-diazide-4-sulfochloride, Naphthaquino-1,2-diazide-5-sulfochloride, Napthoquinone-1,2-diazide-4-sulfochloride, the analogous carboxy acid chlorides, and the like. Generally the amount of sensitizer is from about ten weight percent to ninety weight percent, basis weight of resin, and preferably from about 25 to about 50 weight percent, basis weight of resin.

Exemplary solvents for positive photoresists include: cellosolve ethers such as ethylene glycol momoethyl ether and ethylene glycol momomethyl ether; cellosolve acetates such as ethylene glycol momoethyl ether acetate; aliphatic esters such as butylacetate; aromatic hydrocarbons such as xylene and ethyl benzene; chlorinated hydrocarbons such as chlorobenzene and methylene chloride; and ketones, exemplified by cyclic ketones such as cyclohexanone.

The photoresist compositions are typically supplied in a solution of about 15 to about 45 weight percent photoresist polumer in solvent, the composition having a viscosity of from about 50 to about 125 centistokes at 25° centigrade. As herein contemplated, the photoresist composition is diluted to from about 2 to about 8 percent solids, e.g., by adding thinner. By thinners are meant compatible solvents. By reducing the solids content a photoresist composition is obtained having a viscosity of from about 1 to about 20 centistokes. In this way a self supoprting, flexible, thin film of photoresist composition may be formed separately from the circuit element to be coated.

The thin, flexible film of photoresist composition is formed by forming a pool of photoresist composition in a trough of an extrusion die and imposing a hydrostatic head across the extrusion die to force to photoresist composition out of the extrusion die through an orifice. The film of photoresist composition is formed in close proximity to the surface to be coated, for example from about 0.002 inch to about 0.01 inch from the surface to be coated, although it may be formed further away, or even performed. As herein contemplated, a thin wall of photoresist composition issued from the orifice and layers on the etchable surface of the circuit element.

The film thickness as applied and prior to any treatment is normally greater than about 5 microns but less then about 103 microns, although thicker and thinner films may be used without deleterious effect.

The film, as deposited, is subjected to a soft bake or a pre-bake process which is carried out with dry air. The soft bake or prebake may be a convection process of a resistance heating process. The purpose of the pre-baking is to drive off solvents. Solvents impede exposure, actinic radiation initiated chemical reactions, and development. The pre-bake process is typically carried out temperatures of from about 70° to about 120° centigrade for about 10 minutes to about 40 minutes, and preferably at temperatures from about 90° to about 105° centigrade at times from about 20 minutes to 30 minutes. The exact times and temperatures may be found by routine experimentation. As a result of the pre-bake the thickness of the photoresist deposit is reduced to about 0.2 to about 2.0 micron.

Thereafter, the photoresist material is exposed to actinic radiation. Typically the actinic radiation has wavelengths from about 200 to 500 nonometers. Typically the amount of actinic radiation is from about 4 to about 60 milliwatts per square centimeter for about 2 to 8 seconds and the source of the actinic radiation is a mercury vapor lamp. The exact exposure time and intensity may be found by routine experimentation.

The photoresist is then developed to remove regions of higher relative solublity and while leaving behind regions of lower relative solublity corresponding directly or complimentarily to the image of the photo mask. Development may be carried out by immersion, or spray. Development is carried out for times of from about 15 to about 150 seconds, and generally from about 30 to about 60 seconds. When the development is immersion development, nitrogen bubble agitation maybe used. After development the surface is rinsed, for example with deionized water.

Spray development is particularly preferred because it allows continuous renewal of developing solution at the solution-photoresist interface. Moreover, there is a certain ablative, abrasive, brushing, or washing action of the spray which removes the more soluble fraction of the photoresist material.

Development and rinsing are followed by drying, for example with air or nitrogen, and by post baking. Post baking is typically carried out at temperatures from about 100° centigrade to about 200° centigrade, whereby to cause the less soluble portion of the photoresist, which remains after development and rinsing, to adhere more strongly to the surface of the electronic circuit element.

After post baking, the etchant is applied to the now uncovered and unprotected surface of the etchable circuit material. Exemplary etchants are dilute solutions of oxidizers, for example: nitric acid; solutions of phosphoric acid, nitric acid and hydrofluoric acid; solutions of boric acid, nitric acid and hydrofluoric acid; solutions of ammonium hydroxide in methanol with a pH of 9; buffered solutions of hydorfluoric acid; and solutions of nitric acid, hydroflouric acid and water. The solution is an aqueous solution, although an alcohol, such as methanol, ethylene glycol, or glycerine may be added to the acid solution to moderate the etching reaction. After etching the remaining photoresist is removed, for example by abrasion, or by hot, chlorinated hydrocarbon solutions, known in the art as degreasers. These include trichloroethylene, tetrachloroethylene, and mixtures thereof.

Turning now to the Figures, FIG. 1 shows a preferred exemplification of the method of this invention wherein a continuous, flexible, mechanical substrate 1 is withdrawn from a roll 101 of substrate material and passed through three amorphous semiconductor amorphous deposition chambers 103,105,107 whereby to deposit three layers of amorphous semiconductor materials. For example, p-type, extrinsic semiconductor material may be applied in deposition chamber 103 followed by intrinsic amorphous silicon semiconductor in deposition chamber 105 and extrinsic, n-type amorphous silicon semiconductor in deposition chamber 107. Thereafter, a thin film or layer of conductive material may be applied atop the n-type extrinsic type semiconductor layer and subsequently have a pattern etched therein. The surface to be etched may be a conductor, a semiconductor, an insulator, or a material settable or switchable between said states. It may be amorphous, polycrystalline, crystalline, or switchable or settable there between, or a mixture thereof. Thus the surface to be etched may be an amorphous semiconductor alloy, or a settable material having a comparatively conductive state and a comparatively non-conductive state, as a chalcogenide.

Etching is a multi-step process which includes pretreating the electronic circuit element, for example, by heating. Heating chamber 109 may contain resistance heating means 110, or conductive heating means, not shown to heat the semiconductor coated substrate to a temperature of about 85° C. to about 350° C. for from about 10 to 30 minutes. After heating, the photoresist composition 11 is applied in compartment or chamber 111. It is applied as a film to the integrated circuit element, with a feed of photoresist composition through inlet 21 to an extrusion diehead 23 having an orifice 31 therein.

The substantially continuous circuit element is drawn through the chamber 111 at a constant, linear speed without rotatory or angular velocity or acceleration components. Preferably the linear speed of the continuous circuit element is slightly greater than the linear speed of photoresist composition film 11a from the orifice 31 in the extruder diehead 23. This results in a drawdown 11b of the photoresist composition film 11.

The photoresist composition film 11c coated circuit element proceeds out of the coating chamber 111 to a drying chamber 113 where resistance heating elements 114 or conduction provide heating to drive off solvent which may be recovered. This step results in reducing the thickness of the photoresist film by a factor of about 5 to 400.

The photoresist film coated continuous circuit element then proceeds to photographic chamber or compartment 115 where a photomask 116 is placed on the surface thereof and the photoresist film 11 is exposed to actinic radiation through the photomask 116, for example from light source 117. After exposure, the photoresist coated circuit element proceeds to developing and spraying chamber 119 where developer or developer and rinse are sprayed on the surface thereof. This removes regions of relatively high solubility, while allowing regions of relatively low solubility to remain substantially undisturbed thereon.

Next, the photoresist coated circuit element, having a facsimile of the photomask thereon, and with portions of etchable surface uncovered through the photoresist, may be heated, e.g., in chamber 121, to harden the remaining photoresist. Subsequently, the photoresist coated circuit element passes to an etching chamber 123 where an etchant solution is applied thereto through nozzles 124. After etching is substantially complete the etched, photoresist coated circuit element passes to a further chamber 125 for removal of remaining photoresist material. Thereafter, the etched continuous integrated circuit may be treated in a subsequent deposition chamber 127, for example to apply a further layer of amorphous semiconductor material or a layer of conductive material. Additionally, there may be further deposition and photoresist steps carried out and the continuous circuit element is drawn up on a roller 129.

Figure 2:
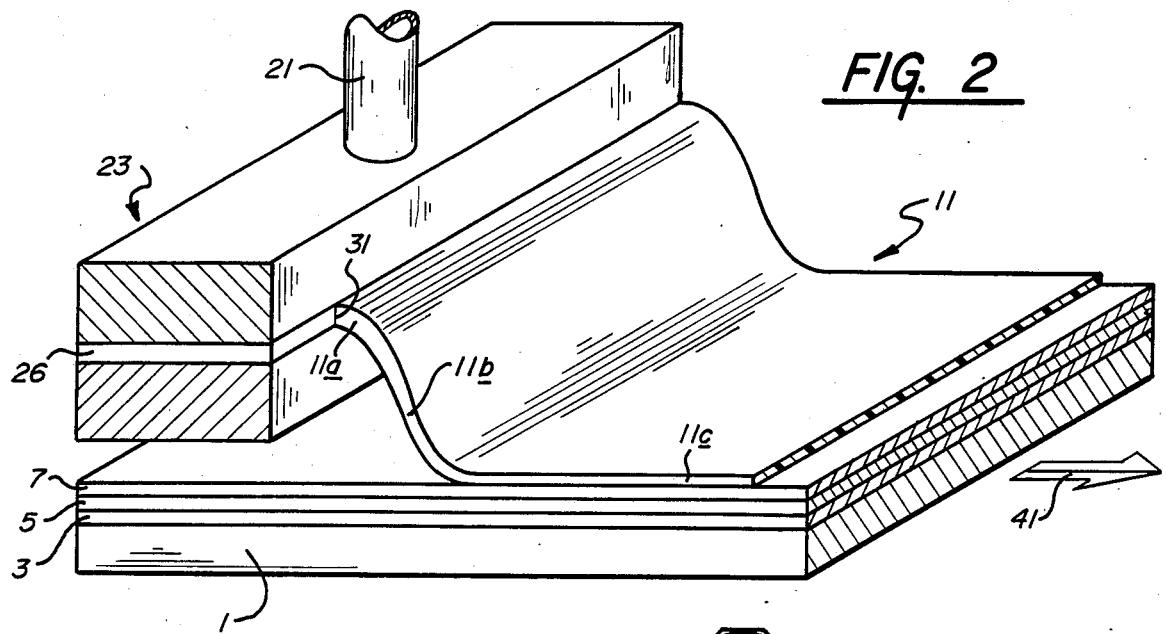
FIG. 2 shows a schematic view of the formation of the photoresist film separate from the etchable surface layer and deposition of the photoresist on the etchable surface layer with draw down of the photoresist film.

FIG. 2 shows the formation of the photoresist composition film remote from the thin film surface to be etched, and subsequent deposition of the photoresist composition film on the surface to be etched. As shown in FIG. 2 a circuit element having a flexible, mechanical substrate 1 with layers of p-type amorphous silicon semiconductor material 3, intrinsic amorphous silicon semiconductor material 5, and n-type amorphous semiconductor silicon semiconductor material 7 deposited thereon passes under an extrusion head 23. The extrusion head 23 is formed of a bottom half 24 and a top half 25 with a gasket 26 therebetween. Photoresist composition is fed into the extruder head 23 under a positive pressure through feed line 21 and forced out through a substantially horizontal orifice 31. The orifice is spaced from the top layer 7, by about 0.002 to 0.01 inch whereby to allow the extrude film 11 to issue as a thick film 11a and be drawn down to film of intermediate thickness 11b and thereafter to a thin extrudate film 11c.

The circuit element moves in a linear direction 41, with respect to the orifice 31. Preferably the circuit element moves at a higher linear velocity then the linear velocity of photoresist film 11 composition issuing from the orifice 31, whereby to draw down the film of photoresist composition. For example, as shown in FIG. 2, the photoresist composition is thicker at numeral 11a at the orifice 31 and thinner at numeral 11c as it meets the top layer 7 of the integrated circuit element, because of the draw down effect.

Figure 3:
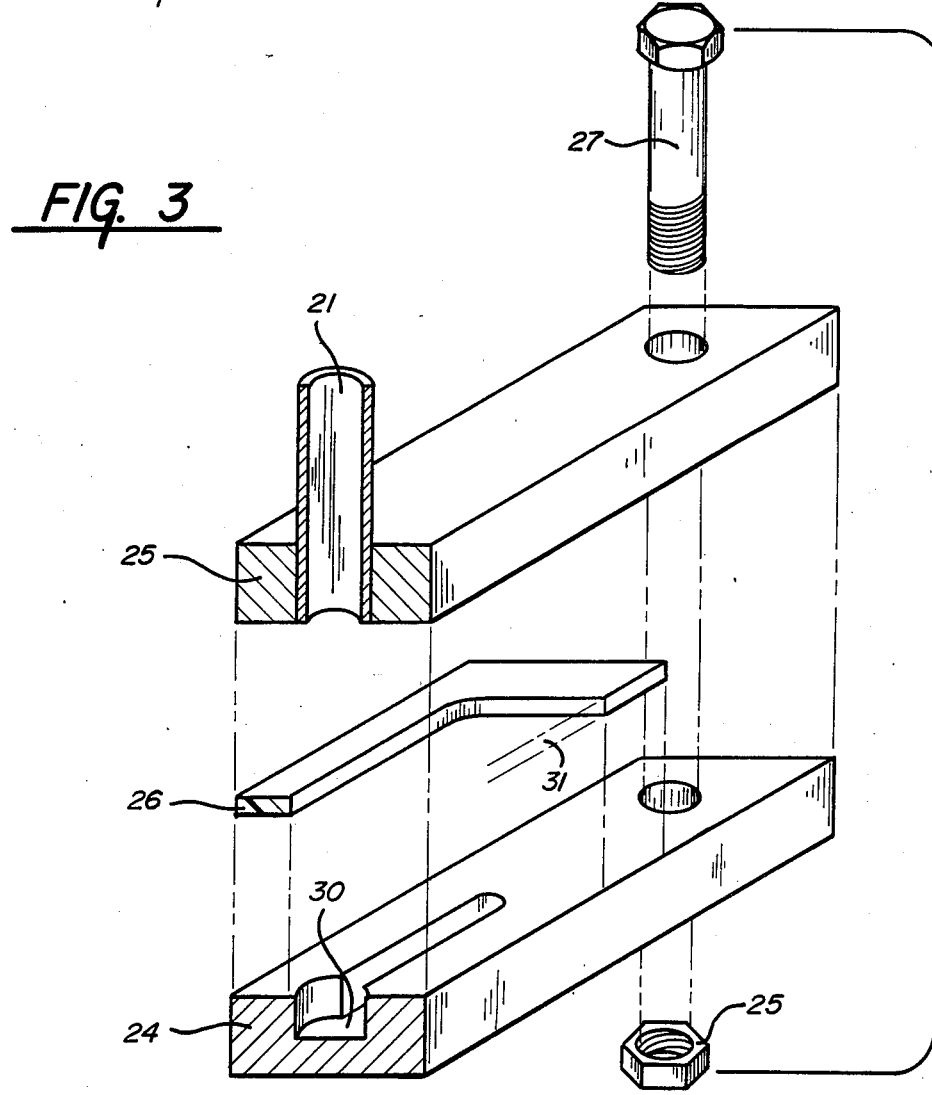
FIG. 3 is an exploded, partial cut-away view of the extrusion head having an orifice therein for forming the film of photoresist material.

FIG. 3 shows and extrusion die head 23 in partial cutaway. The die head 23 has a top portion 25, a bottom portion 24, and a gasket 26 therebetween. The top portion 25 has a photoresist feed line 21 therein. The bottom portion 24 has a trough 30 therein to provide a pool of photoresist composition.

The positive hydrostatic head of photoresist composition in the feed line 21 provides a driving force for the photoresist composition 11 which issues forth from the orifice 31 formed by the notch in the gasket 26. As shown in FIGS. 2 and 3, the thickness of the gasket 26 in general determines the nominal height of the orifice 31. The gasket 26 is typically about 0.001 to about 0.005 inch thick. The extrusion head is maintained in compression, for example by bolt 27 and nut 25 means shown in the figure.

As shown in FIGS. 2 and 3 the photoresist composition is extruded through a slot or die as a film a layer 11 remote from the for surface 7 of the underlying circuit element and forms a 11c surface thereon.

High pressure in the photoresist composition feed line 21 drives the photoresist composition polymer, solvent, and initiator into and through the die. The film issuing forth from the orifice 31 is less than about 50 microns thick, is for example, preferably from about 2 to about 10 microns thick. The film issues forth from the extruder die orifice 31 as a thin, unsupported web of a gummy or syrupy liquid, having a viscosity of from about 1 centistoke to about 20 centistokes at 25° centigrade.

The die 23 is a t-shaped die, also known as a manifold type flat film die, with adjustable top 25 and bottom 24 portions. That is, they are adjustable through the gasket 26. As best shown in FIG. 2, the die opening 31 may be arranged to be substantially perpendicular in two dimensions to the direction of linar travel 41 of the circuit element. The die opening or orifice 31 may be equal to the thickness of the desired wet film photoresist material 11 to about 10 times as thick as the desired thickness of the wet film or photoresist material, with thinning being caused by drawn down.

When the die opening or orifice 31 is thicker then the desired thickness of the deposited wet photoresist film 11c, the speed of taking up the film on the electronic circuit element or structure to be coated is high enough to significantly drawn down the film with concurrent thinning as described above.

While the method of this invention has been described with respect to integrated circuit elements formed on a flexible, substantially continuous mechanical substrate, capable of being formed in a roll to roll mode, it is to be understood that the method of this invention may also be used in the fabrication of electronic components, or circuit elements characterized by rigid, substantially non flexible mechanical substrates, including crystalline substrates. Additionally, while the method of this invention has been described with respect to integrated circuit elements, it is to be understood that by the term integrated circuit elements is comprehended thereby solar cell panels, display panels, piezo electric input panels, and light sensitive input panels.

Moreover, the scope of protection is not intended to be limited by the above described embodiment and exemplifications, but solely by the claims appended hereto.

I claim:

1. A method of forming an electronic circuit element comprising the steps of:
   (1) depositing a photoresist layer atop a surface of the element to be subsequently processed by:
      a. forming a viscous liquid comprising photoresist and solvent separate from the electronic circuit element surface;
      b. forcing the viscous liquid through an elongate, horizontal orifice less than 50 microns thick and in close proximity to but spaced from the electronic circuit element surface to form a flexible, substantially continuous viscous web thereof less than 50 microns thick and capable of maintaining its form and integrity between the orifice and the electronic circuit element surface;
      c. moving the circuit element linearly with respect to the orifice at a linear velocity greater than the linear velocity of the viscous composition issuing from the elongated horizontal orifice whereby to draw down and stretch the viscous liquid composition between the orifice and the electronic circuit element surface, thereby depositing a wet film of photoresist on the electronic circuit element surface at a lesser thickness then the viscous composition issuing from the orifice; and
      d. heating the film of photoresist to drive off solvent therefrom, thereby providing a thin, adherent film of photoresist of 0.2 to 2.0 micron thickness on the electronic circuit element surface.
   (2) exposing at least portions of the photoresist film to actinic radiation;
   (3) developing at least portions of the photoresist film;
   (4) removing soluble portions of the photoresist to uncover at least portions of the electronic circuit element surface; and
   (5) processing at least portions of the uncovered circuit element surface.

2. The method of claim 1 wherein the liquid photoresist composition comprises from about 2 to about 8 weight percent solids, balance solvent.

3. The method of claim 2 wherein the photoresist is a positive photoresist, and the solid comprise phenol terminated phenol formaldehyde photoresist polymer and quinone diazide photosensitizer.

4. The method of claim 2 wherein the photoresist is a negative photoresist, and the solids comprise photoresist polymer chosen from the group consisting of photoactive cinnamates, diallyl phthalate prepolymer resins and isoprenoid resins, and photosensitizer chosen from the group consisting of azido compounds, nitro compounds, nitroaniline derivatives, anthrones, quinones, diphenyls, and thiazolines.

5. The method of claim 1 wherein the liquid photoresist composition has a kinematic viscosity at 25 degrees centigrade of less than about 20 centistokes.

6. The method of claim 5 wherein the liquid photoresist composition has a kinematic viscosity at 25 degrees centigrade of from about 1 centistokes to about 20 centistokes.

7. The method of claim 1 wherein the horizontal, elongate orifice is less than about 0.01 inch from the electronic circuit element surface.

8. The method of claim 7 wherein the distance is in the range from 0.002 inch to 0.01 inch.

9. The method of claim 1 wherein the film issues from the orifice initially moving in the same general direction relative to the orifice as and generally parallel to the surface to be processed.

10. The method of claim 9 wherein the orifice constitutes the die opening of a manifold type film die, said die opening having a major dimension which is substantially horizontal to the surface to be processed and which is substantially perpendicular to the direction of movement between the orifice and the surface to be processed.

11. The method of claim 1 wherein the orifice has a height of less than about 0.005 inch.

12. The method of claim 1 wherein the orifice has a height in the range of about 0.001 inch to 0.005 inch.

13. The method of claim 1 wherein the thickness of the film issuing from the orifice is from 2 microns to 10 microns.

14. The method of claim 1 comprising drawing down the issued film composition whereby the wet deposited film is from about two to about ten times thinner than the film issuing from the orifice.

15. The method of claim 1 comprising depositing a relatively thick film of the wet deposited film on the surface to be processed and heating the wet deposited film to drive off solvent therefrom and provide a relatively thin photoresist film.

16. The method of claim 15 wherein the thickness of the wet deposited film on the surface to be processed is from approximately 5 microns to approximately 100 microns heating the deposited film reduces the thickness of the photoresist film to approximately 0.2 microns to approximately 2 microns.

17. The method of claim 1 comprising heating the deposited wet film to reduce the thickness thereof by a factor of 5 to 400.

18. The method of claim 1 wherein the surface to be processed is an etchable surface.

19. The method of claim 1 wherein the surface to be processed is formed of a material chosen from the group consisting of conductors, semiconductors, insulators, and compositions settable between said states.

20. The method of claim 1 wherein the surface to be processed is formed of a material chosen from the group consisting of amorphous materials, polycrystalline materials, crystalline materials, compositions settable between said states, and mixtures thereof.

21. The method of claim 1 wherein the surface to be processed is formed of an amorphous semiconductor alloy.

22. The method of claim 1 wherein the surface to be processed is formed of a settable material having a comparatively non-conductive state and a comparatively high conductive state that is settable from one of said states to the other of said states.

23. The method of claim 22 wherein the settable material is settable and resettable between said states.

24. The method of claim 22 wherein the settable material is a chalcogenide.

25. The method of claim 1 comprising forming the electronic circuit element on a flexible substrate.

26. The method of claim 25 comprising withdrawing the flexible mechanical substrate from a roll for formation of the electronic circuit element thereon.

27. The method of claim 26 comprising collecting the flexible mechanical substrate having the circuit element formed thereon on a roll.

28. The method of claim 1 wherein the element has a major dimension greater than three inches.

29. A method of forming an electronic circuit element on a continuous flexible mechanical substrate with at least one surface dimension in excess of three inches, comprising the steps of:
 (1) withdrawing flexible substrate from a roll thereof;
 (2) passing the flexible substrate through at least one stage of semiconductor deposition means whereby to deposit at least one layer of semiconductor material of the flexible substrate;
 (3) depositing a photoresist layer atop a surface of the element to be subsequently processed by:
  a. forming a viscous liquid comprising photoresist and solvent separate from the semiconductor material deposited on the surface of the flexible substrate;
  b. forcing the viscous liquid through an elongate, horizontal orifice less than 50 microns thick and in close proximity to but spaced from the semiconductor material deposited on the surface of the flexible substrate to form a flexible, substantially continuous viscous web thereof less than 50 microns thick and capable of maintaining its form and integrity between the orifice and the semiconductor material deposited on the flexible substrate surface;
  c. moving the flexible substrate including the circuit element linearly with respect to the orifice at a linear velocity greater than the linear velocity of the viscous composition issuing from the elongated horizontal orifice whereby to draw down and stretch the viscous liquid composition between the orifice and the electronic circuit element surface, thereby depositing a wet film of photoresist atop the semiconductor material deposited on the flexible substrate at a lesser thickness than the viscous composition issuing from the orifice; and
  d. heating the film of photoresist to drive off solvent therefrom, thereby providing a thin, adherent film of photoresist of 0.2 to 2.0 micron thickness atop the deposited semiconductor material on the flexible substrate surface;
 (4) exposing at least portions of the photoresist film to actinic radiation;
 (5) developing at least portions of the photoresist film;
 (6) removing soluble portions of the photoresist to uncover at least portions of the deposited semiconductor material on the surface of the flexible substrate;
 (7) processing at least portions of the uncovered deposited semiconductor material on the surface of the flexible substrate; and
 (8) collecting the continuous flexible substrate having an electronic circuit element thereon on roll means.

30. The method of claim 29 wherein the liquid photoresist composition comprises from about 2 to about 8 weight percent solids, balance solvent.

31. The method of claim 30 wherein the photoresist is a positive photoresist, and the solids comprise phenol terminated phenol formaldehyde photoresist polymer and quinone diazide photosensitizer.

32. The method of claim 30 wherein the photoresist is a negative photoresist, and the solids comprise photoresist polymer chosen from the group consisting of photoactive cinnamates, diallyl phthalate prepolymer resins, and isoprenoid resins and photosensitizer chosen from the group consisting of axido compounds, nitro compounds, nitroaniline derivatives, anthrones, quinones, diphenyls, and thiazolines.

33. The method of claim 30 wherein the liquid photoresist composition has a kinematic viscosity at 25 degrees centigrade of from about 1 centistoke to about 20 centistokes.

34. The method of claim 29 comprising depositing a relatively thick film of the wet deposited film on the deposited semiconductor material and heating the wet deposited film to drive off solvent therefrom and provide a relatively thin, photoresist film.

35. The method of claim 34 comprising depositing the wet deposited photoresist film on the deposited semiconductor to a thickness of from approximately 5 microns to approximately 100 microns, and heating the wet deposited photoresist film to reduce the thickness thereof to from approximately 0.2 microns to approximately 2 microns.

36. The method of claim 29 wherein the electronic element has a surface formed of a material chosen from the group consisting of conductors, semiconductors, insulators, and compositions settable between said states.

37. The method of claim 29 wherein the surface of the electronic element is formed of a material chosen from the group consisting of amorphous materials, polycrystalline materials, crystaline materials, compositions settable between said states, and mixtures thereof.

38. The method of claim 29 wherein the surface of the electronic element is formed of an amorphous semiconductor alloy.

39. The method of claim 29 wherein the surface of the electronic element is formed of a settable material having a comparatively non-conductive state and a comparatively high conductive state that is settable from one of said states to the other of said states.

40. The method of claim 39 wherein the settable material is settable and resettable between said states.

41. The method of claim 39 wherein the settable material is a chalcogenide.

* * * * *